US009601585B2

(12) United States Patent
Chu et al.

(10) Patent No.: US 9,601,585 B2
(45) Date of Patent: Mar. 21, 2017

(54) TRANSISTOR HAVING A WING REGION

(71) Applicant: TAIWAN SEMICONDUCTOR MANUFACTURING COMPANY, LTD., Hsinchu (TW)

(72) Inventors: Chen-Liang Chu, Hsinchu (TW); Fei-Yuh Chen, Hsinchu (TW); Yi-Sheng Chen, Hsinchu (TW); Shih-Kuang Hsiao, Hsinchu (TW); Chun Lin Tsai, Hsinchu (TW); Kong-Beng Thei, Pao-Shan Village (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/751,999

(22) Filed: Jun. 26, 2015

(65) Prior Publication Data
US 2015/0295055 A1 Oct. 15, 2015

Related U.S. Application Data

(63) Continuation of application No. 13/213,409, filed on Aug. 19, 2011, now Pat. No. 9,099,556.

(51) Int. Cl.
*H01L 29/78* (2006.01)
*H01L 29/417* (2006.01)
(Continued)

(52) U.S. Cl.
CPC .... *H01L 29/41775* (2013.01); *H01L 29/0692* (2013.01); *H01L 29/1033* (2013.01); *H01L 29/78* (2013.01); *H01L 29/7823* (2013.01); *H01L 29/7835* (2013.01); *H01L 29/0653* (2013.01); *H01L 29/1045* (2013.01)

(58) Field of Classification Search
CPC . H01L 29/76; H01L 29/7835; H01L 29/0653; H01L 29/0692; H01L 29/1033; H01L 29/1945
USPC ........ 257/288, 335, 336, 344, 346, E21.432, 257/E29.135, E29.266
See application file for complete search history.

(56) References Cited

U.S. PATENT DOCUMENTS 6,104,063 A * 8/2000 Fulford, Jr. ....... H01L 29/66492
257/336
2004/0097041 A1 5/2004 Mandelman et al.
(Continued)

OTHER PUBLICATIONS

Chien, Feng-Tso, et al., "A Novel High Channel Density Trench Power MOSFETs Design", by Asymmetric Wing-cell Structure, Dept. of Electronic Engineering, Feng-Chia University, Taichung Taiwan and Dept. of Electrical Engineering, National Central University, Jhongli Taiwan, 7 pages.

*Primary Examiner* — Selim Ahmed
(74) *Attorney, Agent, or Firm* — Hauptman Ham, LLP

(57) ABSTRACT

A transistor includes an isolation region surrounding an active region. The transistor also includes a gate dielectric layer over a portion of the active region. The transistor further includes a gate electrode over the gate dielectric layer. The portion of the active region under the gate dielectric layer includes a channel region between a drain region and a source region, and at least one wing region adjoining the channel region. The at least one wing region has a base edge adjoining the channel region. The at least one wing region is polygonal or curved.

20 Claims, 7 Drawing Sheets

(51) Int. Cl.
  *H01L 29/10* (2006.01)
  *H01L 29/06* (2006.01)

(56) References Cited

U.S. PATENT DOCUMENTS

| | | |
|---|---|---|
| 2007/0018258 A1 | 1/2007 | Chen et al. |
| 2007/0190715 A1 | 8/2007 | Ohta |
| 2009/0256212 A1 | 10/2009 | Denison et al. |
| 2010/0084708 A1* | 4/2010 | Park .................... H01L 29/0873 |
| | | 257/343 |
| 2010/0276688 A1 | 11/2010 | Yano et al. |
| 2012/0069651 A1* | 3/2012 | Lee .................... G11C 16/0416 |
| | | 365/185.2 |

* cited by examiner

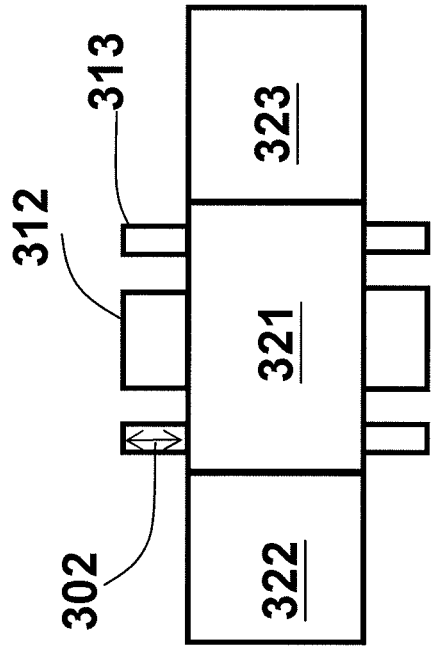
Figure 3A
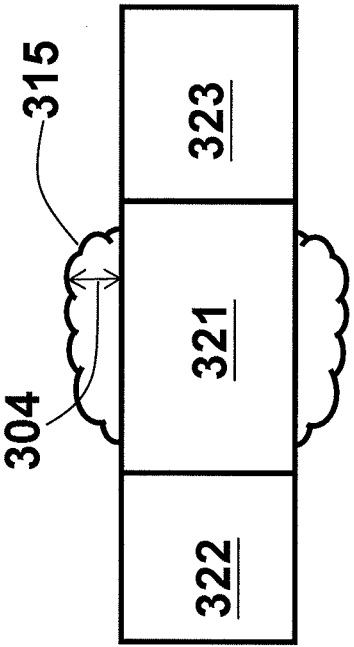
Figure 3B
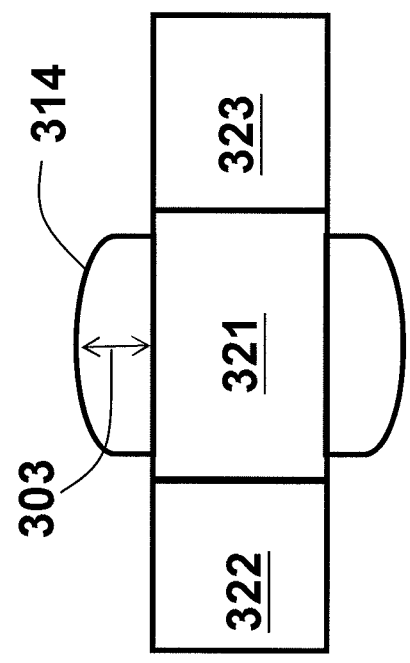
Figure 3C
Figure 3D

View A

View B

TRANSISTOR HAVING A WING REGION

PRIORITY CLAIM

The present application is a continuation of U.S. application Ser. No. 13/213,409, filed Aug. 19, 2011, which is incorporated herein by reference in its entirety.

FIELD

The present disclosure is related to a semiconductor device. Particularly, the present disclosure is related to medium and high voltage transistor devices having wing structures.

BACKGROUND

When thin gate oxide devices such as metal-oxide-semiconductor field effect transistors (MOSFETs) are adopted for medium and high-voltage applications, it takes multiple processes to overcome problems with respect to electrical performance and integration. Lightly doped well implants are usually employed to optimize the breakdown voltage. For example, a thin gate oxide lateral double diffusion metal-oxide-semiconductor (LDMOS) transistor may utilize several light well doping concentrations to increase the breakdown voltage. However, applying a light doping concentration to wells of a thin gate LDMOS uses several photomasks and increases the manufacturing costs of the device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A to 3H are top views of different examples of a transistor active region having wing regions in accordance with various embodiments of the present disclosure.

DETAILED DESCRIPTION

Figure 1:
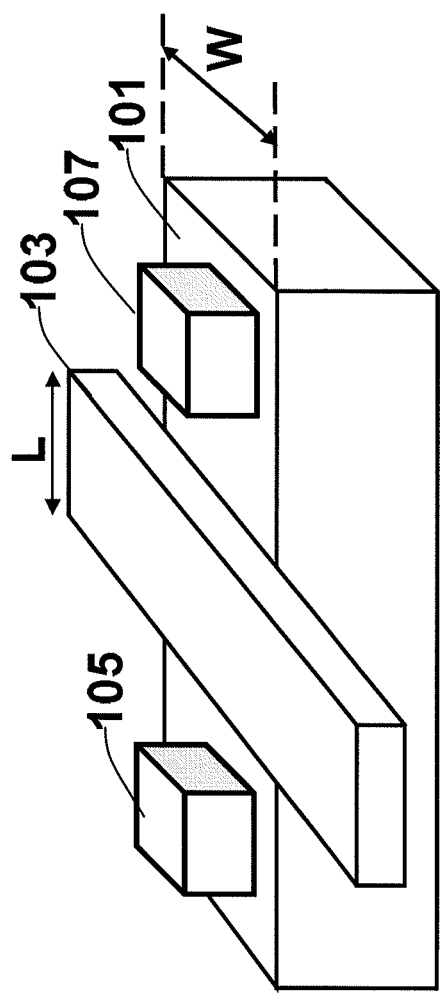
FIG. 1 is a perspective view of a prior art transistor.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a perspective view depicting relative positions and shapes of a conventional metal-oxide semiconductor field effect transistor (MOSFET). A MOSFET is used for amplifying or switching electrical signals. A voltage on the oxide-insulated gate electrode 103 can induce a conducting channel within an active region 101 between the two other contacts called source 105 and drain 107 located across the gate electrode. The channel can be of n-type or p-type, and is accordingly called an nMOSFET or a pMOSFET (also commonly nMOS, pMOS). The active region 101 includes a source region, a drain region, and the channel region. The active region is surrounded by isolation regions (not shown) to separate adjacent transistors from each other. The channel region 101 has a width W and a length L, commonly referred to as the channel width and length. The channel width is about the same width as the source and drain regions. The channel length is about the same length as a width of the gate electrode. The conductivity type of materials in the active region is usually accomplished by implanting impurities into a semiconductor material. Various transistor designs vary the type and amount of impurities implanted into different parts of the active region 101 in order to modify conductivity of the material(s). For example, the channel region may be n-type or p-type, and the source and drain regions may have opposite conductivity type from the channel region. In some transistors, more than one types of conductivity is used at the source region or drain region. For example, the source region may include an n-type well and a p-type well. In other transistors, multiple wells with conductivity gradients are used, such as a bigger well of a lower n-type conductivity and a smaller well of a higher n-type conductivity within the bigger well. Some transistors also include various small isolation regions embedded in the active region.

When MOSFETs are operated in medium (about 2-8 volts) to high (about 8-400 volts) voltage to very high (above about 400 volts) applications, impact ionization generates a large amount of electrons that become trapped by strong corner electric fields at the interface between the channel region and isolation regions around the channel region. The trapped electrons damage the oxide material around the channel region and repel channel current flow, in effect adding resistance to current flow in the channel. The effect furthers degradation of the breakdown voltage and threshold voltage for the transistor. The trapping effect is more significant for transistors having channel widths ranging, for example, from about 0.42 microns to about 2 microns. In one instance of a digital to analog (DAC) device having a channel width of about 0.42 microns, the breakdown voltage degrades to about 2 volts and the threshold voltage increases from about 1 volt to about 2.5 volts after a few cycles of operation, rendering the device inoperable for intended purpose because the threshold voltage became larger than the breakdown voltage.

Forming graded wells can reduce the drain electric field and thus the electronic trapping effect. In order to form concentration gradients of different doping concentrations in a graded well, at least two photomasks are used to mask different portions of the active region from ion implantation. The use of photomasks increases manufacturing cost by having to design and make photomasks and having additional manufacturing steps associated with each lithography application. Thus a device design and method for manufacturing medium to high voltage transistors while minimizing the number of lithography operations are sought.

Figure 2:
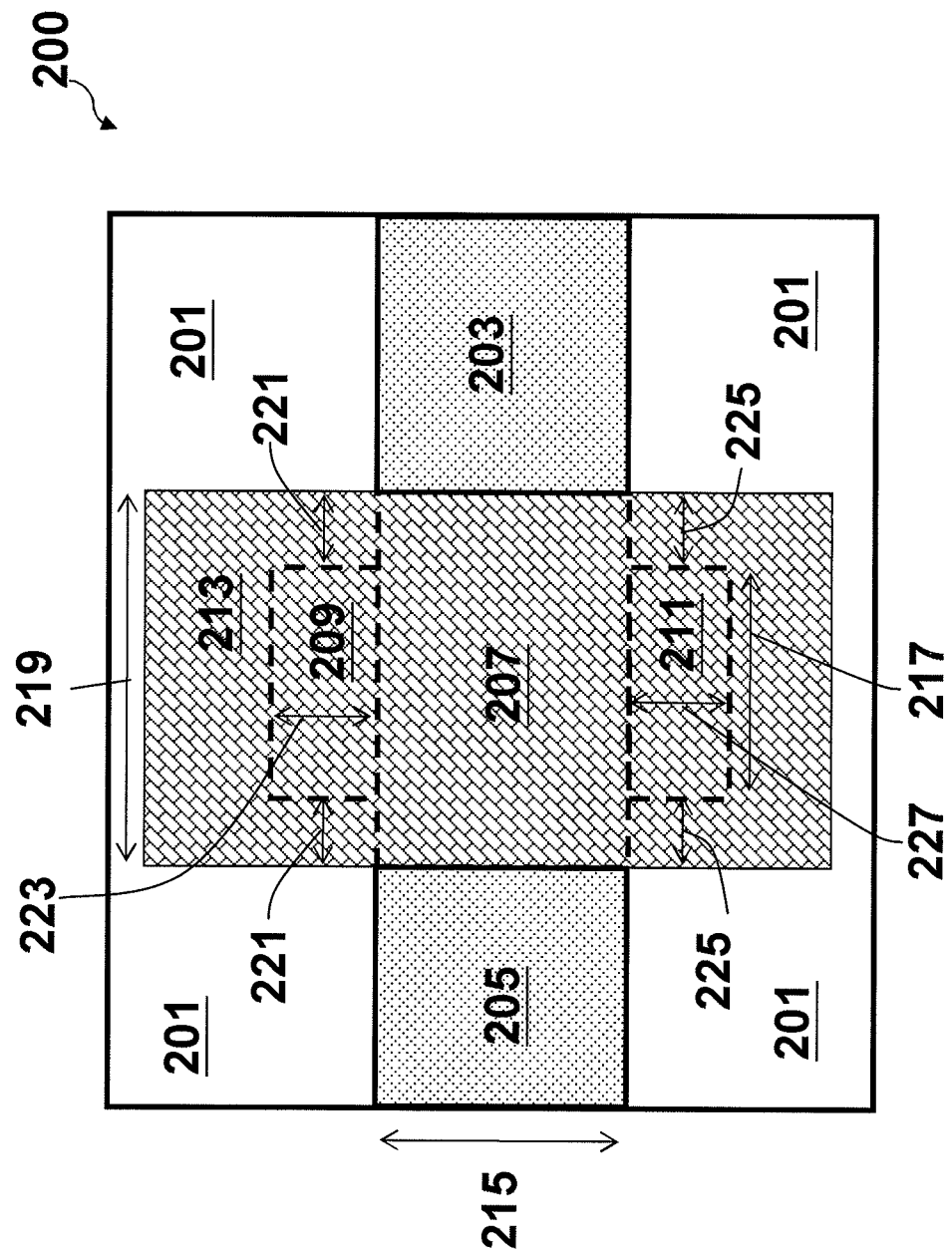
FIG. 2 is a top view of an embodiment of a transistor in accordance with various embodiments of the present disclosure.

FIG. 2 is a top view of a transistor 200 depicting an example layout structure for the transistor 200 in accordance with various embodiments of the present disclosure that reduces the deleterious effects of the heavy impact ionization caused by medium to high voltage operation without using a doping concentration gradient and thus minimizing the number of photolithography operations. The transistor 200 includes an isolation region 201 surrounding an active region (203, 205, 207, 209, and 211 combined) and a gate electrode 213 over a portion of the active region. The active region includes a source region 203, a channel region 207, a drain region 203, and at least one wing region (209 and 211) adjoining the channel region 207. The source region 205 and the drain region 203 and located across the channel region 207. The at least one wing region 209 or 211 may be located on the same side of the channel region 207 or on difference sides of the channel region 207, as shown in FIG. 2. In FIG. 2, the wing regions 209 and 211 are located symmetrically across the channel region 207.

The channel region 207 has a width 215 and a length 219. In some embodiments, the width 215 is the same as that of the source region 205 and the drain region 203. The channel length 219 may be the same as the width of the gate electrode 213. The wing regions 209 and 211 also have lengths, for example, 217, and widths, for example, 223 and 227.

According to various embodiments, the wing regions 209 and 211 do not extend past the channel region 207 in the channel length direction and is completely under the gate electrode 213. While exposing a portion of the wing region 209 or 211 would not necessarily harm the transistor, having the wing regions 209 or 211 under the gate electrode 213 reduces the possibility that a contact would be placed too close to the wing region 209 or 211 and cause a short circuit. Further, the active region is minimized, which reduces material cost. Thus, the wing region length 217 may be the same or less than the channel length 219. Because the gate electrode 213 and the active region are formed using different photomasks, an overlay shift 221 and 225 may be built in to ensure that the wing regions 209 and 211 are completely under the gate electrode 213. This overlay shift 221 or 225 may be specified based on the lithography process used because different lithography processes have different maximum overlay shifts and correction methods. For example, for a channel length of about 1 micron, the overlay shift 221 and 225 may be specified at about 0.1 microns. That is, even if the photomasks did not completely overlay each other and mismatch by up to 0.1 micron, the wing regions 209 and 211 would still be completely under the gate electrode 213. As overlay correction methods advance, the overlay shift may be specified at a smaller value.

According to various embodiments, the wing regions 209 and 211 are formed with channel region 207 and include the same materials and doping. Thus, only one photomask is used to form the active region including the channel region 207 and wing regions 209 and 211. It is believed that the wing region shifts the corner electric field away from the current channel during transistor operation. Shifting the electric field away reduces electron trapping. Trapped electrons are also further removed from the channel region, which reduces the resistance effect causing by the electrons repelling the current.

In some embodiments, the widths 223 and 227 of the wing regions 209 and 211 are defined relative to the channel width 215. In some embodiments, a minimum width for the width 223 or 227 at the widest portion of the wing region may be defined as a percentage of the channel width, for example, at between about 10% to about 50% of the channel width, which may be between about 0.1 to about 2 microns. In one example, the minimum width at the widest portion is at least 0.2 micron to move the electric field sufficiently away from the channel region.

Figure 3E:
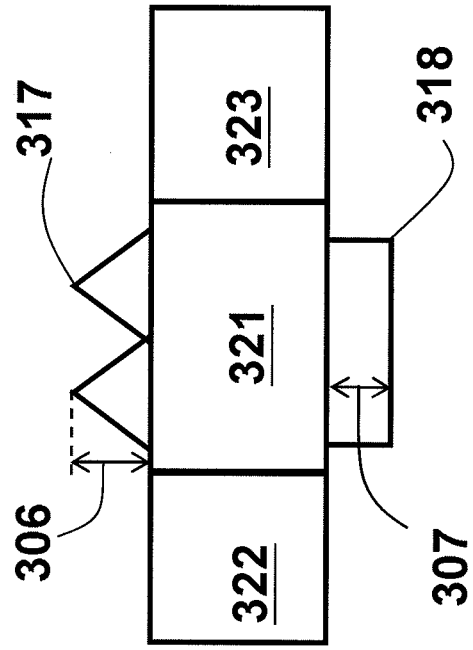

This minimum width at the widest portion at of the wing region 209 and 211 may vary with the shape of the wing regions 209 and 211. FIGS. 3A to 3H, in addition to FIG. 2, depict various example shapes of the wing regions and are not exhaustive. FIG. 2 depicts one rectangular wing region 209 or 211 on each side of the channel region 207. The rectangular wing regions are substantially reflectively symmetrical across the channel region. FIG. 3A shows two rectangular regions 311 on each side of the channel region having a minimum width 301 at the widest portion of the wing regions. The rectangular wing regions 311 are also substantially reflectively symmetrical across the channel region 321. The edges of the wing regions closest to the source and drain regions (322 and 323) are offset from the channel region edge by an overlay shift offset 341. In some embodiments, the overlay shift offset 341 may be different for the drain region edge and the source drain region edge, depending on the electric field.

FIG. 3B shows three rectangular regions (312 and 313) on each side of the channel region 321 having a minimum width 302 at the widest portion of the wing regions. The rectangular wing regions (312 and 313) are also substantially reflectively symmetrical across the channel region. The rectangular wing regions (312 and 313) shown may be equally spaced, but need not be. Further, the rectangular regions (312 and 313) need not be the same size or have the same shape. As depicted in FIG. 3B, in at least one embodiment, one rectangular wing region 312 is longer (along the channel width direction) than the other rectangular wing region 313.

FIG. 3C shows one rounded wing region 314 on each side of the channel region 321 having a minimum width 303 at the widest portion of the wing region 314. The rounded wing regions 314 are also substantially reflectively symmetrical across the channel region 321. Similar to the embodiments having rectangular wing regions, the number and size of rounded wing regions 314 are not limited. Note that with current photolithography processes, it is likely that rectangular wing regions such as 311, 312, and 313 as depicted in FIGS. 3A and 3B will be formed with rounded corners after the manufacturing processes.

FIG. 3D shows one irregular shaped wing region 315 on each side of the channel region 321 having a minimum width 304 at the widest portion of the wing region 315. The irregular shaped wing regions 315 are also substantially reflectively symmetrical across the channel region 321. FIG. 3E shows one saw-toothed wing region 316 on each side of the channel region having a minimum width 305 at the widest portion of the wing region 316. The irregular shaped wing regions 316 are also substantially reflectively symmetrical across the channel region 321.

Figure 3F:
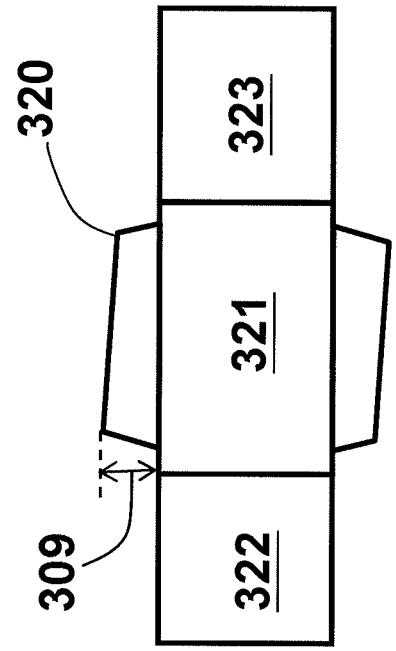

FIG. 3F shows two triangular wing regions 317 on one side of the channel region 321 and a rectangular wing region 318 on the other side of the channel region. The triangular wing regions 317 have a minimum width 306 at the widest portion of the wing regions 317. The rectangular wing region 318 has a width 307. There is no symmetry in this example. This is an example where the wing regions across the channel 321 are not the same shape and/or have the same numbers.

Figure 3G:
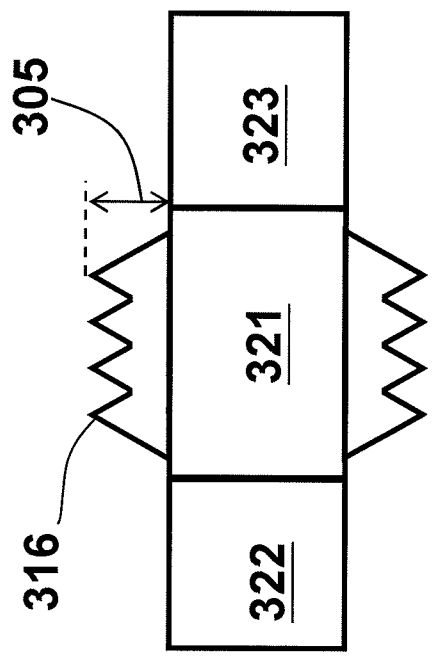

FIG. 3G shows one round-wave shaped wing region 319 on only one side of the channel region 321 having a minimum width 308 at the widest portion of the wing region 319. For wider channels, for example, a channel width of above 2 microns, having a wing region on only one side of the channel region may be sufficient to reduce the voltage degradations. Of course, the wing region shape is only illustrative, the single-sided wing region may be of any shapes described herein or be of any other shape that can sufficiently move the electric field away from the current channel.

Figure 3H:
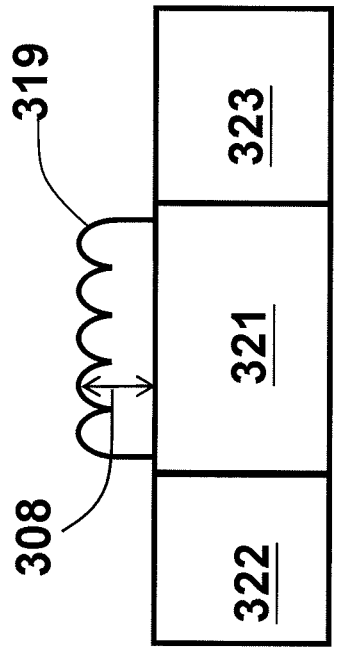

FIG. 3H shows one irregular quadrilateral wing region 320 on each side of the channel region having a minimum width 309 at the widest portion of the wing region. This example shows a rotational symmetry about an imaginary axis at the center of the channel region 321.

Figure 4A:
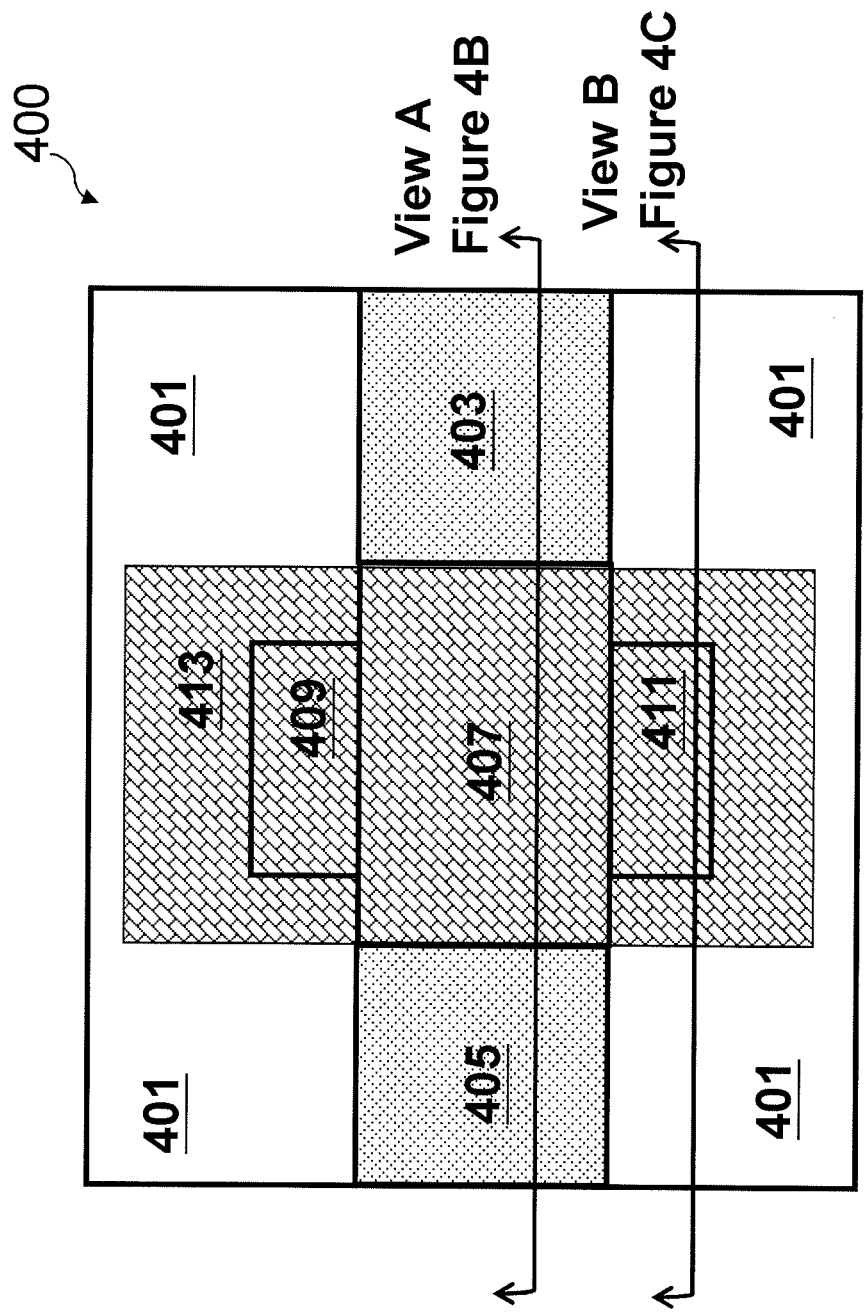
FIG. 4A is a top view of an embodiment of an LDMOS transistor in accordance with various embodiments of the present disclosure.

The active region layout with wing regions is applicable to any horizontal/lateral transistor design. Particularly, the wing regions may be used in lateral power MOSFETs such as laterally diffused metal oxide semiconductor/lateral double-diffused MOS (LDMOS) and double diffused drain MOS (DDDMOS) transistors. FIG. 4A is a top view of an example LDMOS transistor 400 according to various embodiments of the present disclosure. The LDMOS transistor 400 includes an isolation region 401 surrounding an active region (403, 405, 407, 409, and 411 combined) and a gate electrode 413 over a portion of the active region. The active region includes a source region 403, a channel region 407, a drain region 403, and at least one wing region (409 and 411) adjoining the channel region 407. The source region 405 and the drain region 403 and located across the channel region. Wing regions 409 and 411 are located symmetrically across the channel region 407. In at least one embodiment, wing regions 409 and 411 have the same material and structure as the channel region 407. Sectional Views A and B shows two different cuts of the LDMOS 400, where View A shows a structure that is usually shown and described in association with LDMOS and View B shows a structure including the wing region 411.

Figure 4B:
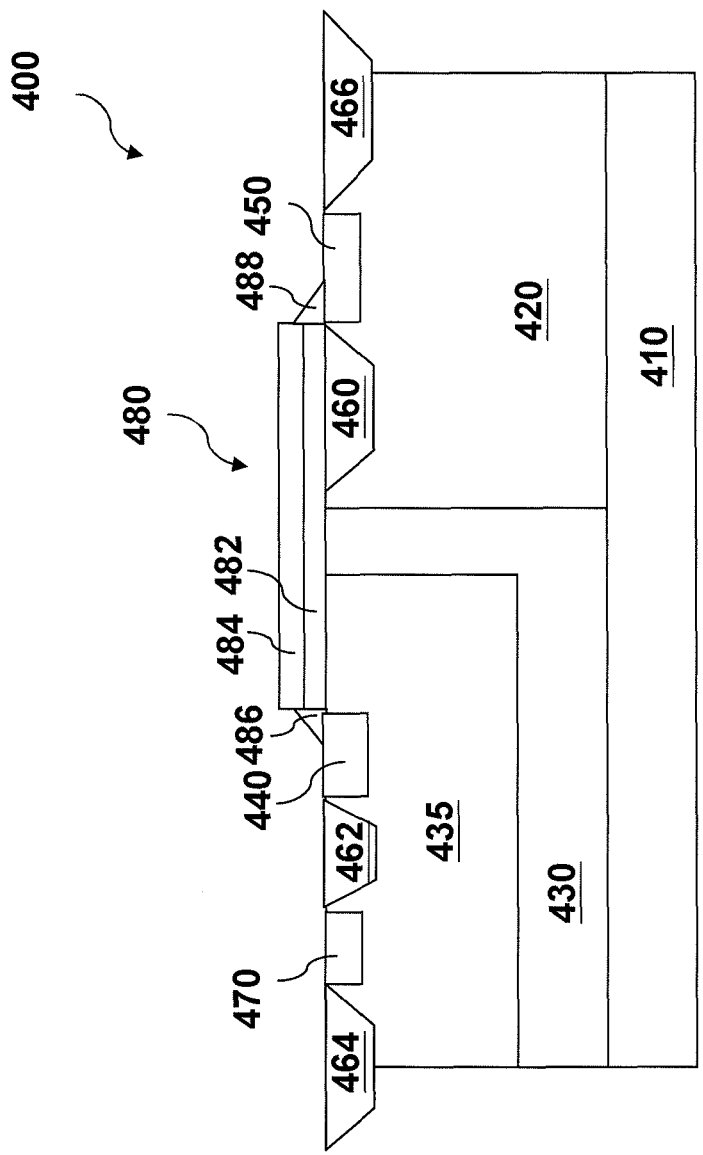
FIGS. 4B and 4C are cross sectional views of the LDMOS transistor in FIG. 4A in accordance with various embodiments of the present disclosure.

FIG. 4B is a cross-sectional view of the LDMOS 400 of FIG. 4A according to view A. View A cuts across the entire active region. In FIG. 4B, the LDMOS 400 includes a substrate 410, which is usually a silicon substrate but may alternatively include silicon germanium, gallium arsenic, or other suitable semiconductor materials. The substrate 410 may further include other features such as a buried layer or an epitaxy layer.

The substrate 410 has an N-well region 420 (also referred to as high-voltage N-well or HVNW). HVNW 420 has an N-type dopant and may have a doping concentration ranging between about $10^{15}$ and $10^{17}$ cm$^{-3}$. HVNW 420 may have a thickness ranging between about 2 micrometers and 5 micrometers.

A P-well region 430 (also referred to as high-voltage P-well or HVPW) is located in the substrate 410 and is adjacent HVNW 420. HVPW 430 has a P-type dopant and may have a doping concentration ranging between about $10^{15}$ and $10^{17}$ cm$^{-3}$. HVPW 410 may have a thickness ranging between about 1.5 micrometers and 4 micrometers. For example, HVPW 430 may be about 2.5 micrometers thick.

A P-well region 435 (also referred to as low-voltage P-well or LVPW) is disposed overlying a portion of HVPW 430 and laterally contacts another portion of HVPW 430. In other embodiments, the P-well region 435 directly laterally contacts HVNW 420 without an intervening portion of HVPW 430. LVPW 435 has a P-type dopant and may have a doping concentration ranging between about $10^{16}$ and $10^{18}$ cm$^{-3}$. LVPW 435 may have a thickness ranging between about 0.5 micrometers and 2 micrometers. In another example, the thickness of LVPW 435 may range between about 1 micrometers and 1.5 micrometers.

Doping regions including HVPW 420, LVPW 430, and LVPW 435 may be formed by suitable doping processes such as ion implantation. As LVPW 430 and LVPW 435 substantially overlaps each other, LVPW 430 and LVPW 435 may be formed by a series of chain implanting processes under the same patterned doping opening, with enhanced manufacturing efficiency. HVPW 430 and LVPW 435 may be formed with a P-type dopant such as boron, and HVNW 430 may be formed with an N-type dopant such as phosphorus. HVNW 420, HVPW 430, and LVPW 435 may be formed, respectively, by a plurality of processing steps now known or to be developed such as growing a sacrificial oxide on substrate 410, opening a pattern for the location of the N-well region or P-well region, and implanting the impurities. Note that in some LDMOS transistors, the LVPW 435 may be adjacent to HVNM 420 with having some HVPW 430 formed therebetween.

An N-type dopant region 440 functioning as a source is disposed in LVPW 435. An N-type doped region 450 functioning as a drain is disposed in HVNW 420. The source 440 and drain 450 may be doped with an N-type impurity such as phosphorous for a N-channel metal-oxide-semiconductor (MOS) transistor. The source 440 and drain 450 may be formed by ion implantation and/or diffusion. Other processing steps may be further included to form the source 440 and drain 450. For example, a rapid thermal annealing (RTA) process may be used to activate the implanted dopant. The source and drain may have different doping profiles formed by multi-step implantation. For example, additional doping features such as light doped drain (LDD) or double diffused drain (DDD) may be included. Also, the source and drain may have different structures, such as raised, recessed, or strained. A channel region is defined between the source 440 and the drain 450.

An isolation feature 460 may be disposed in HVNW 420 and laterally between the source 440 and the drain 450. The isolation feature may be adjacent the drain 450. The isolation feature 460 may be a shallow trench isolation (STI) or other suitable isolation structures such as a local oxidation of silicon (LOCOS) structure or a deep trench isolation. The isolation feature may have a thickness more than about 1 micrometer.

In addition to the isolation feature 460, the LDMOS 400 may further include various isolation features such as 462, 464, and 466 located and designed to define various active features and isolate them from each other. The LVPW 435 may further include a P-doped region 470 that functions as a body contact to the LVPW 435. The body contact 470 may be doped with higher concentration of P-type impurity (such as boron) than that of the LVPW 435 to provide a contact to LVPW 435.

A gate 480 is formed on the substrate 410 and interposed laterally between the source 440 and drain 450. The gate 480 may extend over the isolation feature 460 between the source 440 and drain 450. The gate 480 includes a thin gate dielectric 482 having a thickness such that a low-voltage (for example, a voltage between about 1 volt and 6 volts) is applicable to operate the LDMOS 400. The thickness of the thin gate dielectric may range between about 50 Angstroms and 300 Angstroms. For example, the gate dielectric 482 may have a thickness about 130 Angstroms. The gate dielectric 482 may include silicon oxide, high dielectric-constant (high k) materials, silicon oxynitride, other suitable material, or combinations thereof. The gate dielectric 482 may be formed using chemical vapor deposition (CVD), physical vapor deposition (PVD), atomic layer deposition (ALD), thermal oxide, other suitable processes, or combinations thereof. The gate 480 includes a gate electrode 484 to be coupled to metal interconnects and is disposed overlying the gate dielectric 482. The gate 480 may further include spacers 486 and 488 formed on both sides of the gate electrode 484 and the gate dielectric 482.

Figure 4C:
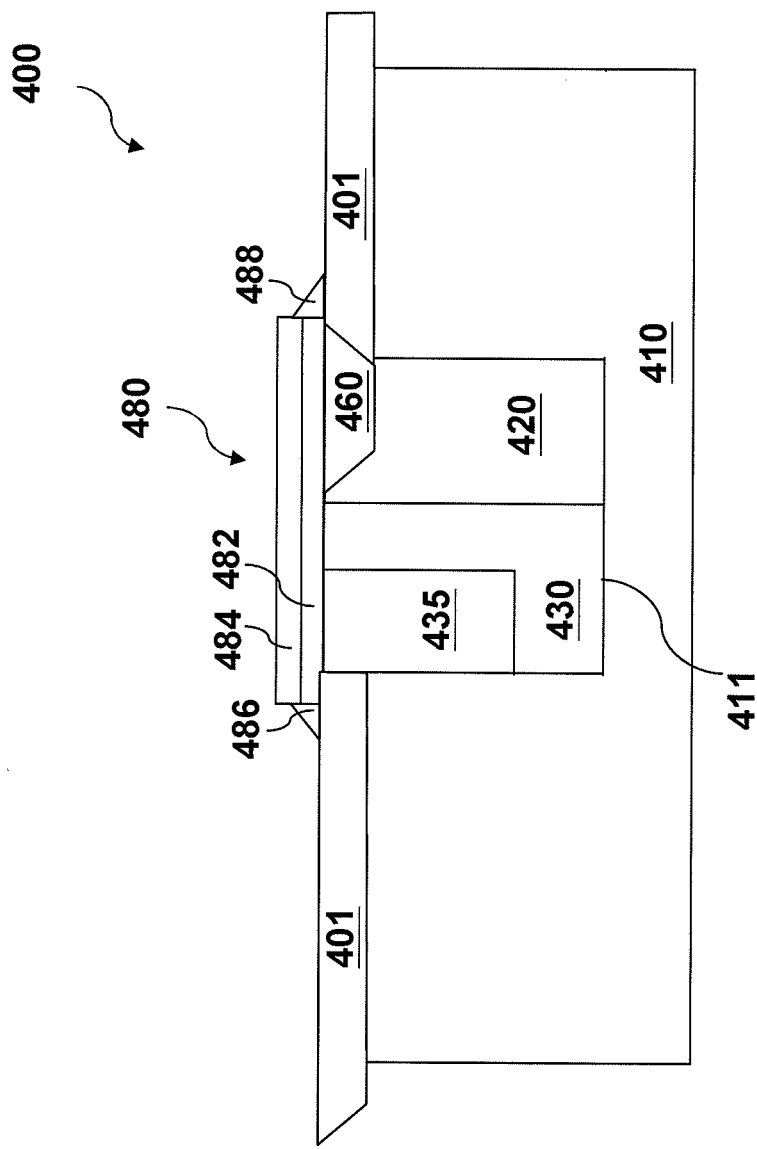

FIG. 4C is a sectional view of the LDMOS 400 of FIG. 4A according to view B. View B cuts across the wing region 411 portion of the active region. In FIG. 4C, the LDMOS 400 includes a substrate 410 as described above. In some embodiments, the wing region 411 includes the same material and structures of the channel region 407, including the HVNW 420, HVPW 430, the LVPW 435, and the isolation features 460, which may be STI or LOCOS. Isolation feature 460 from FIG. 4B connects to isolation feature 401 in FIG. 4C. On the source side, isolation feature 401 connects to isolation features 464 and 462 from FIG. 4B. On the drain side of the LDMOS 400, isolation feature 401 connects to isolation feature 466 from FIG. 4B.

The wing region 411 has a lengthwise edge adjoining the channel region 407 (FIG. 4A) and an opposite edge adjoining isolation feature 401. In effect, the isolation feature 401 wraps around the entire active region of the transistor 400, including the opposite edges of the wing regions under the gate electrode stack.

The isolation 401 features may include different structures and can be formed using different processing technologies. For example, an isolation feature 401 may include local oxidation of silicon (LOCOS), shallow trench isolation (STI), and/or other suitable isolation structures. LOCOS may be formed using a thermal oxidation under a patterned mask layer. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In at least one embodiment, the STI structure is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

FIGS. 4A to 4C describes one type of transistor, the LDMOS transistor, that can include wing regions to reduce the electron trapping effects without using additional photomasks in the manufacturing process. Other types of transistors and different LDMOS designs other than the one described, may also use the wing regions to overcome the same effect. Examples include, but are not limited to, DDDMOS and other horizontal power MOSFETs.

A number of MOSFETs are manufactured at the same time, usually in a pattern to form a logic unit or a functional unit. A logic unit or a functional unit may also include other semiconductor devices and other types, designs, or size of transistors. Gate electrode of each transistor may be connected to an overlying interconnect structure through low resistant interfaces. The overlaying interconnect structure includes conductive materials and may have multilayer structure. A number of logic units and/or functional units together with the interconnect structure forms an integrated circuit. The interconnect structure extends along and/or through one or more dielectric layers to electrically connect features in one interconnect layer and/or between interconnect layers. The interconnect structure includes contacts to various transistor components, such as gate contacts, body contacts, source contacts, and/or drain contacts. The interconnects may include copper, tungsten, titanium, titanium nitride, gold, aluminum, carbon nano-tubes, carbon fullerenes, conductive refractory metals, alloys of these materials and/or other materials, and may be formed by CVD, PVD, plating and/or other processes. The dielectric layer may include silicon dioxide, FSG, BLACK DIAMOND® (a product of Applied Materials of Santa Clara, Calif.), XERO-GEL, AEROGEL, amorphous fluorinated carbon, PARYLENE, BCB, FLARE, and SILK, and/or other materials, and may be formed by CVD, ALD, PVD, spin-on coating and/or other processes.

In one aspect, the present disclosure provides a transistor including an isolation region surrounding an active region. The transistor also includes a gate dielectric layer over a portion of the active region. The transistor further includes a gate electrode over the gate dielectric layer. The portion of the active region under the gate dielectric layer includes a channel region between a drain region and a source region, and at least one wing region adjoining the channel region. The at least one wing region has a base edge adjoining the channel region. The at least one wing region is polygonal or curved.

In another aspect, the present disclosure provides an integrated circuit including an active region. The active region includes a source region, a drain region, a channel region, a first wing region and a second wing region. The first wing region having a first shape and the second wing region having a second shape. The first shape being different than the second shape. The first wing region being across the channel region from the second wing region. The integrated circuit also includes an isolation region surrounding the active region. The integrated circuit further includes a gate dielectric layer over the channel region, the first wing region, the second wing region, or a portion of the isolation region. The integrated circuit further includes a gate electrode over the gate dielectric layer.

In still another aspect, the present disclosure provides a lateral drain MOS (LDMOS) transistor including a gate electrode, a drain region, a source region, a channel region and at least one wing region. The LDMOS transistor also includes a first isolation region and a second isolation region. The drain region is between the gate electrode and the first isolation region. The source region is between the gate electrode and the second isolation region. The source region being disposed across the gate electrode from the drain region. The channel region is under the gate electrode, and between the drain region and the source region. The channel region having a length. The at least one wing region adjoining the channel region. The at least one wing region has a length shorter than or equal to the length of the channel region.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A transistor comprising:
    an isolation region surrounding an active region;
    a gate dielectric layer over a portion of the active region;
    a gate electrode over the gate dielectric layer, wherein the portion of the active region under the gate dielectric layer includes a channel region between a drain region and a source region; and
    at least one wing region located outside of the channel region in a channel region width direction and adjoining the channel region, wherein the at least one wing region has a base edge adjoining the channel region, and the at least one wing region is polygonal or curved, and wherein the channel region width direction is different from a channel region length direction from the drain region to the source region.

2. The transistor of claim 1, wherein the at least one wing region includes a first wing region and a second wing region disposed along the channel region.

3. The transistor circuit of claim 2, wherein the first wing region and the second wing region are symmetrical.

4. The transistor circuit of claim 2, wherein the first wing region and the second wing region are asymmetrical.

5. The transistor of claim 1, wherein the at least one wing region is configured to shift corner electric fields away from a current flow during a period that a voltage ranging from about 2V to about 400V is applied to the gate electrode.

6. The transistor of claim 1, wherein an entirety of the at least one wing region is below the gate electrode.

7. The transistor of claim 2, wherein the first wing region and the second wind region are on a same side of the channel region.

8. The transistor of claim 1, wherein a length of the at least one wing region is equal to or less than a length of the channel region.

9. An integrated circuit comprising:
    an active region including a source region, a drain region, a channel region, a first wing region and a second wing region, the first wing region having a first shape and the second wing region having a second shape, the first shape being different than the second shape, and the first wing region being across the channel region from the second wing region;
    an isolation region surrounding the active region;
    a gate dielectric layer over the channel region, the first wing region, the second wing region, or a portion of the isolation region; and
    a gate electrode over the gate dielectric layer.

10. The integrated circuit of claim 9, wherein the first shape is a first polygonal shaped pattern, the first wing region ending at least about 0.1 microns from a closest edge of the gate dielectric layer.

11. The integrated circuit of claim 10, wherein the second shape is a second polygonal shaped pattern, the second wing region ending at least about 0.1 microns from a closest edge of the gate dielectric layer.

12. The integrated circuit of claim 9, wherein the first wing region or the second wing region is configured to shift corner electric fields away from a current flow during a period that a voltage ranging from about 8V to about 400V is applied to the gate electrode.

13. The integrated circuit of claim 9, wherein the first wing region is offset across the channel region with respect to the second wing region.

14. The integrated circuit of claim 9, wherein the first wing region or the second wing region has a maximum width of at least about 0.2 microns.

15. The integrated circuit of claim 9, wherein the first wing region or the second wing region has a width ranging from about 0.1 microns to about 2 microns.

16. A lateral drain metal oxide semiconductor (LDMOS) transistor comprising:
    a gate electrode;
    a drain region between the gate electrode and a first isolation region;
    a source region between the gate electrode and a second isolation region, the source region disposed across the gate electrode from the drain region;
    a channel region under the gate electrode, and between the drain region and the source region, the channel region having a length; and
    a first wing region located outside of the channel region in a channel region width direction and adjoining the channel region, wherein the channel region width direction is different from a channel region length direction from the drain region to the source region, and wherein the first wing region has a length shorter than or equal to the length of the channel region, and the first wing region has a saw shaped pattern, a curved pattern or an irregular shaped pattern.

17. The LDMOS transistor of claim 16, wherein the first wing region ends at least 0.1 microns from a closest edge of the gate dielectric layer.

18. The LDMOS transistor of claim 16, further comprising a second wing region adjoining the channel region.

19. The LDMOS transistor of claim 18, wherein the first wing region and the second wing region are symmetrical.

20. The transistor LDMOS circuit of claim 18, wherein the first wing region or the second wing region is configured to shift corner electric fields away from a current flow during a period that a voltage ranging from about 8V to about 400V is applied to the gate electrode.

* * * * *